United States Patent [19]

Ker et al.

[11] Patent Number: 5,637,900
[45] Date of Patent: Jun. 10, 1997

[54] LATCHUP-FREE FULLY-PROTECTED CMOS ON-CHIP ESD PROTECTION CIRCUIT

[75] Inventors: Ming-Dou Ker, Tainan; Tain-Shun Wu, Miou-Lee, both of Taiwan

[73] Assignee: Industrial Technology Research Institute, Hsinchu, Taiwan

[21] Appl. No.: 419,638

[22] Filed: Apr. 6, 1995

[51] Int. Cl.$^6$ .................................................. H01L 23/62
[52] U.S. Cl. .................... 257/355; 257/358; 257/360; 257/362; 257/363
[58] Field of Search ............................... 257/355, 358, 257/360, 363, 362

[56] References Cited

U.S. PATENT DOCUMENTS

| | | | |
|---|---|---|---|
| 4,605,980 | 8/1986 | Hartranft et al. | 361/56 |
| 4,692,781 | 9/1987 | Rountree et al. | 357/23.13 |
| 4,734,752 | 3/1988 | Liu et al. | 357/23.4 |
| 4,745,450 | 5/1988 | Hartranft et al. | 357/23.13 |
| 4,807,080 | 2/1989 | Clark | 361/56 |
| 4,819,046 | 4/1989 | Misu | 357/23.13 |
| 4,896,243 | 1/1990 | Chatterjee et al. | 362/91 |
| 4,939,616 | 7/1990 | Rountree | 361/56 |
| 5,001,529 | 3/1991 | Ohshima et al. | 357/23.13 |
| 5,010,380 | 4/1991 | Avery | 357/23.13 |
| 5,012,317 | 4/1991 | Rountree | 357/38 |
| 5,019,888 | 5/1991 | Scott et al. | 357/41 |
| 5,077,591 | 12/1991 | Chen et al. | 357/23.1 |
| 5,140,401 | 8/1992 | Ker et al. | 357/43 |
| 5,166,089 | 11/1992 | Chen et al. | 437/51 |
| 5,182,220 | 1/1993 | Ker et al. | 437/34 |
| 5,218,222 | 6/1993 | Roberts | 257/362 |
| 5,270,565 | 12/1993 | Lee et al. | 257/358 |
| 5,272,371 | 12/1993 | Bishop et al. | 257/362 |
| 5,274,262 | 12/1993 | Avery | 257/362 |
| 5,289,334 | 2/1994 | Ker et al. | 361/56 |
| 5,329,143 | 7/1994 | Chan et al. | 257/173 |
| 5,336,908 | 8/1994 | Roberts | 257/173 |
| 5,343,053 | 8/1994 | Avery | 257/173 |

OTHER PUBLICATIONS

C. Duvvury and A. Amerasekera, "ESD: A Pervasive Reliability Concern for IC Technologies", *Proc. of IEEE*, vol. 81, No. 5, pp. 690–702, May 1993.

A. Amerasekera and C. Duvvury, "The Impact of Technology Scaling on ESD Robustness and Protection Circuit Design", *1994 EOS/ESD Symp. Proc.*, EOS-16, pp. 237–245.

R.N. Rountree, "ESD Protection for Submicron CMOS Circuits: Issues and Solutions", *1988 IEDM Technical Digest*, pp. 580–583.

R.N. Rountree, C. Duvvury, T. Maki, and H. Stiegler, "A Process-Tolerant Input Protection Circuit for Advanced CMOS Processes", *1988 EOS/ESD Symp. Proc.* EOS-10, pp. 201–205.

C. Duvvury, T. Taylor, J. Lindgren, J. Morris, and S. Kumar, "Input Protection Design for Overall Chip Reliability", *1989 EOS/ESD Symp. Proc.*, EOS-11, pp. 190–197.

(List continued on next page.)

*Primary Examiner*—Mahshid D. Saadat
*Assistant Examiner*—Valencia Martin Wallace
*Attorney, Agent, or Firm*—Meltzer, Lippe, Goldstein, Wolf & Schlissel, P.C.

[57] ABSTRACT

An ESD protection circuit fully protects the input stage of CMOS integrated circuits from four different ESD stress modes by providing four different ESD direct discharging paths. The ESD protection circuit has a primary ESD protection circuit, which has a first and a second thick-oxide MOS devices, and a secondary ESD protection circuit which has a resistor, a first and a second thin-oxide MOS devices. The resistor is connected between the primary and secondary ESD protection circuits. The primary and secondary ESD protection circuits each provide two ESD discharge paths from the input pad, and from the input of the internal circuits to be protected, to VDD and VSS voltage supply buses. The inventive ESD protection circuit also has merged latchup guard rings and protects against large ESDs, while occupying only a small layout area. Furthermore, the inventive ESD protection circuit clamps the voltage level of the input signal between 5.5 to −1 volts, the voltages applied to the thin-oxide CMOS input stage of the internal circuits.

16 Claims, 5 Drawing Sheets

OTHER PUBLICATIONS

G. Rieck and R. Manely, "Novel ESD Protection for Advanced CMOS Output Drivers", *1989 EOS/ESD Symp. Proc.*, EOS–11, pp. 182–189.

C. Duvvury and R. Rountree, "A Synthesis of ESD Input Protection Scheme", *1991 EOS/ESD Symp. Proc.*, EOS–13, pp. 88–97.

C.-Y. Wu, M.-D. Ker, C.-Y. Lee, and J.Ko, "A New On–Chip ESD Protection Circuit with Dual Parasitic SCR Structures for CMOS VLSI", *1992 IEEE Journal of Solid–State Circuits*, vol. 27, No. 3, pp. 274–280.

M.-D. Ker, C.-Y. Wu, and C.-Y. Lee, "A Novel CMOS ESD/EOS Protection Circuit with Full–SCR Structures", *1992 EOS/ESD Symp. Proc.*, EOS–14, pp. 258–264.

M.-D. Ker and C.-Y. Wu, "CMOS On–Chip Electrostatic Discharge Protection Circuit Using Four–SCR Structures with Low ESD–trigger Voltage", *1994 Solid–State Electronics*, vol. 37, No. 1, pp. 17–26.

A. Chatterjee and T. Polgreen, "A Low–Voltage Triggering SCR for On–Chip ESD Protection at Output and Input Pads", *IEEE Electron Device Letters*, vol. 12, No. 1, pp. 21–22, Jan. 1991.

A. Chatterjee and T. Polgreen, "A Low–Voltage Triggering SCR for On–Chip ESD Protection at Output and Input Pads", *1990 Proc. Symposium on VLSI Technology*, pp. 75–76.

C. Duvvury, R.N. Rountree, and O. Adams, "Internal Chip ESD Phenomena Beyond the Protection Circuit", *IEEE Trans. on Electron Devices*, vol. 35, No. 12, pp. 2133–2139, Dec., 1988.

X. Guggenmos and R. Holzner, "A New ESD Protection Concept for VLSI CMOS Circuits Avoiding Circuit Stress", *1991 EOS/ESD Symp. Proc.*, EOS–13, pp. 74–82.

H. Terletzki, W. Nikutta, and W. Reczek, "Influence of the Series Resistance of On–Chip Power Supply Buses on Internal Device Failure after ESD Stress", *IEEE Trans. on Electron Devices*, vol. 40, No. 11, pp. 2081–2083, Nov., 1993.

C. Johnson, T.J. Maloney, and S. Qawami, "Two Unusual HBM ESD Failure Mechanisms on a Mature CMOS Process", *1993 EOS/ESD Symp. Proc.*, EOS–15, pp. 225–231.

C. Duvvury, R. A. McPhee, D. A. Baglee, and R. N. Rountree, "ESD Protection Reliability in 1–μm CMOS Technologies", *1986 IRPS Proc.*, pp. 199–205.

S. Daniel and G. Krieger, "Process and Design Optimization for Advanced CMOS I/O ESD Protection Devices", *1990 EOS/ESD Symp. Proc.*, EOS–12, pp. 206–213.

Y. Wei, Y. Loh, C Wang, and C. Hu, "MOSFET Drain Engineering for ESD Performance", *1992 EOS/ESD Symp. Proc.*, EOS–14 pp. 143–148.

T.L. Polgreen and A. Chatterjee, "Improving the ESD Failure Threshold of Silicided n–MOS Output Transistors by Ensuring Uniform Current Flow", *1992 IEEE Trans. Electron Devices*, vol. 39, No. 2, pp. 379–388.

C. Duvvury, C. Diaz, and T. Haddock, "Achieving Uniform nMOS Device Power Distribution for Submicron ESD Reliability", *1992 IEDM Technical Digest*, pp. 131–134.

C. Duvvury, and C. Diaz, "Dynamic Gate Coupling of NMOS for Efficient Output ESD Protection", *1992 Proc. of IRPS*, pp. 141–150.

Baker, R. Currence, S. Law, M. Le, C. Lee, S.T. Lin & M. Teene, "A Waffle Layout Technique Strengthens the ESD Hardness of the NMOS Output Transistor", 1989 EOS/ESD Symp. Proc. EOS–11, pp. 175–181.

Y.-S. Hu, H.-R. Liauh, and M.-C. Chang, "High Density Input Protection Circuit Design In 1.2 μm CMOS Technology", *1987 EOS/ESD Symp. Proc.*, EOS–9, pp. 179–185.

S.R. Vemura, "Layout Comparison of MOSFETs With Large W/L Ratios" *1992 Electronics Letters*, vol. 28, No. 25, pp. 2327–2329.

LATCHUP-FREE FULLY-PROTECTED CMOS ON-CHIP ESD PROTECTION CIRCUIT

RELATED APPLICATIONS

The following patent applications are assigned to the assignee hereof and contain subject matter related to the subject matter of the present patent application:

1. U.S. patent application Ser. No. 08/419,650, entitled "CMOS On-Chip Four-LVTSCR ESD Protection Scheme", filed on even date herewith for Ming-Dou KER and Tain-Shun WU, now U.S. Pat. No. 5,572,394.

2. U.S. patent application Ser. No. 08/419,636, entitled "CMOS Output Buffer With Enhanced High ESD Protection Capability", filed on even date herewith for Ming-Dou KER and Tain-Shun WU, and 3. U.S. patent application Ser. No. 08/419,637, entitled "N-Sided Polygonal Cell Layout For Multiple Cell Transistor", filed on even date herewith for Ming-Dou KER, Tain-Shun WU and Kuo-Feng WANG. The contents of the above-listed patent applications are incorporated herein by reference.

FIELD OF THE INVENTION

The present invention relates to a latchup-free fully-protected CMOS on-chip circuit for protecting packaged internal integrated circuits (ICs) from undesired high voltage spikes resulting from electrostatic discharges (ESDs) caused by handling. In particular, the present invention directly protects both the NMOS and PMOS devices of the input stage of an integrated circuit against ESD damages.

BACKGROUND OF THE INVENTION

Electrostatic discharges (ESDs) from human handling of a metal-oxide silicon (MOS) IC chip permanently damage the MOS chip. Often the thin-oxide layer that isolates the gate electrode from the substrate of a MOS field effect transistor is irreparably ruptured by a voltage spike applied across it. A voltage spike or ESD is often applied to the gate because the gate electrode is connected to an external terminal or input pin of the IC chip. The external terminals are formed on an input pad. To prevent such damage from excessive electrostatic discharges, a protective device is often connected between the input pad and the gates of the input stage of the integrated circuit.

Such ESD protection becomes even more important as new generation of MOS devices are made with thinner gate oxides using, for example, submicron CMOS technologies. The thin-oxide MOS devices are extremely susceptible to the ESD damage. Therefore, ESD protection has become one of the most important elements with respect to the reliability of submicron CMOS technologies.

In submicron CMOS technologies, a lightly doped drain (LDD) structure is used to overcome the hot carrier degradation, while silicide diffusion is used to reduce the sheet resistances in the drain and source of the CMOS devices.

As MOS devices are made with thinner oxide, using LDD structures and silicided diffusion, the ESD protection circuit has become more important with respect to the reliability of compact MOS IC chips made using sub-micron CMOS technologies. The importance of ESD protection circuits is discussed in many references such as:

(1) C, Duvvury, R. A. McPhee, D. A. Baglee, and R. N. Rountree, "ESD Protection Reliability in 1-μm CMOS Technologies", 1986 IRPS Proc., pp. 199–205.

(2) S. Daniel and G. Krieger, "Process and Design Optimization for advanced CMOS I/O ESD Protection Devices", 1990 EOS/ESD Symp. Proc., EOS-12, pp. 206–213.

(3) Y. Wei, Y. Loh, C Wang, and C. Hu, "MOSFET Drain Engineering for ESD Performance", 1992 EOS/ESD Symp. Proc., EOS-14 pp. 143–148.

ESD protection circuits are used to protect the sensitive thin-oxide gates of the MOS transistors by shunting ESD currents and pulling up (to VDD) or pulling down (to VSS or ground) the undesired voltage spikes (overshoots or undershoots) around the sensitive gates of the input stage. This current shunting and voltage clamping must be accomplished without affecting the normal signal paths, the operation of the transistors or the arrangement of the external terminals or pins of the IC chips. Normally the MOS IC chips operate using two voltage levels, namely, VSS and VDD. Each voltage level is applied to the IC through a common bus or node connected to a power pin of the IC chip. Generally, the ESD pulses have positive and negative polarities applied to both the VDD and the VSS nodes.

Conventional ESD protection circuits are disclosed in X. Guggenmos and R. Holzner, "A New ESD Protection Concept for VLSI CMOS Circuits avoiding Circuit Stress", 1991 EOS/ESD Symp. Proc., EOS-13 pp. 74–82, and in U.S. Pat. Nos. 4,692,781, 4,605,980, 4,745,450, 4,807,080, 4,819,046 and 5,001,529.

Figure 1:
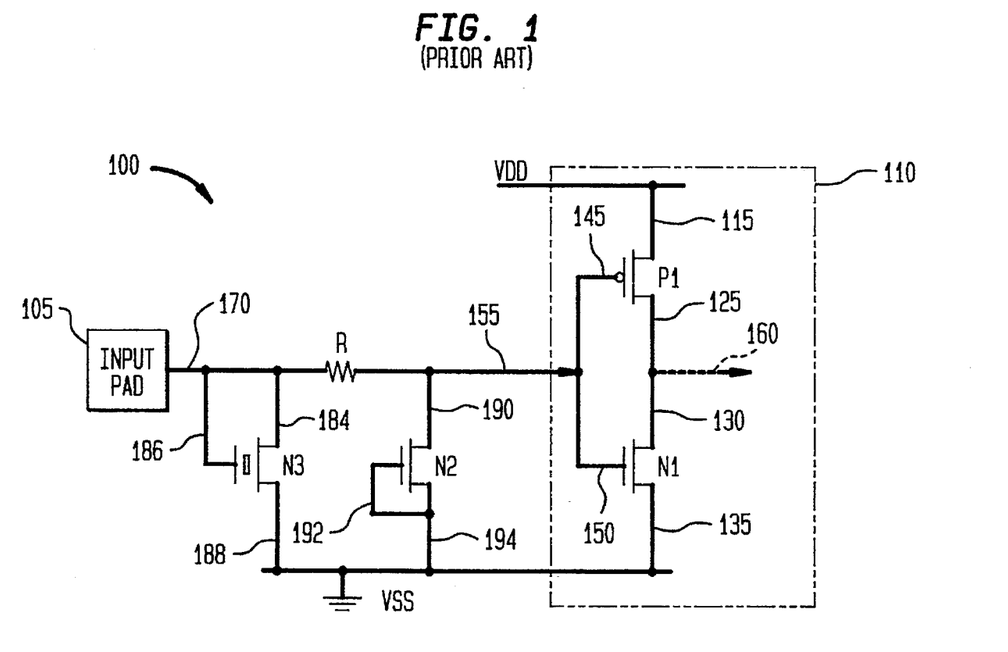
FIG. 1 shows a conventional ESD protection circuit with protection elements only arranged between an input pad and VSS supply voltage.

FIG. 1 shows one conventional ESD protection circuit 100 located between the input pad 105 and the CMOS input stage 110 which is to be protected against excessive high voltages.

Illustratively, the input stage 110 includes a thin-oxide PMOS device P1 and a thin-oxide NMOS device N1. The source 115 of the PMOS device P1 is connected to a VDD bus and its drain 125 is connected to the drain 130 of the NMOS device N1. The source 135 of the NMOS device N1 is connected to a VSS bus which is normally grounded. The gates 145, 150 of the PMOS and NMOS devices P1, N1 are connected together to form an input of the input stage 110. This input is connected to a terminal 155 of the ESD protection circuits 100. The terminal 155 is also the input terminal of the input stage 110. The output of the input stage 110 is formed by the common drain connection 160. Depending on the signal applied to the input of the input stage 115 at terminal 155, the output 160 of the input stage 110 is pulled up to VDD or pulled down to VSS.

The ESD protection circuit 100 is on the same IC chip containing the input pad 105 and the input stage 110. The ESD protection circuit 100 comprises a resistor R and two n-type MOS devices; a thin-oxide NMOS N2 and a thick-oxide NMOS N3.

The resistor R is connected in series between the terminal 170 of the input pad 105 and the terminal 155. This resistor may be a diffusion resistor which is formed by diffusion into the substrate of the integrated circuit in accordance with well known techniques. The thick-oxide NMOS device N3 has its drain 184 and its gate 186 connected to the terminal 170 of the input pad 105. The source 188 of the device N3 is connected to the VSS bus. The thin-oxide NMOS device N2 has its drain connected to the terminal 155 and its gate 192 connected to its source 194 and to the VSS bus.

The thin-oxide NMOS device N2 together with the diffused resistor R act as an isolation stage between the terminal 170 of the input pad 105 and the input stage 110. The thick-oxide NMOS N3 pulls down the voltage of terminal 170 to ground, i.e. to the grounded VSS. Thus, this ESD protection circuit 100 provides an ESD discharging path between the input pad 105 and ground. However, this ESD protection circuit 100 has no direct ESD discharging path to the VDD bus.

With no such direct ESD discharging path from the input pad 105 to the VDD bus, unexpected ESD damage occurs in the internal circuits of the IC chip as described in the following three references:

(1) C. Duvvury, R. N. Rountree, and O. Adams, "internal chip ESD phenomena beyond the protection circuit", *IEEE Trans. on Electron Devices*, vol. 35, no. 12, pp. 2133–2139, Dec., 1988, (2) H. Terletzki, W. Nikutta, and W. Reczek, "Influence of the series resistance of on-chip power supply buses on internal device failure after ESD stress", *IEEE Trans. on Electron Devices*, vol. 40, no. 11, pp. 2081–2083, Nov., 1993, and (3) C. Johnson, T. J. Maloney, and S. Qawami, "Two unusual HBM ESD failure mechanisms on a mature CMOS process", 1993 *EOS/ESD Symp. Proc.*, EOS-15, PP. 225–231.

Figure 2:
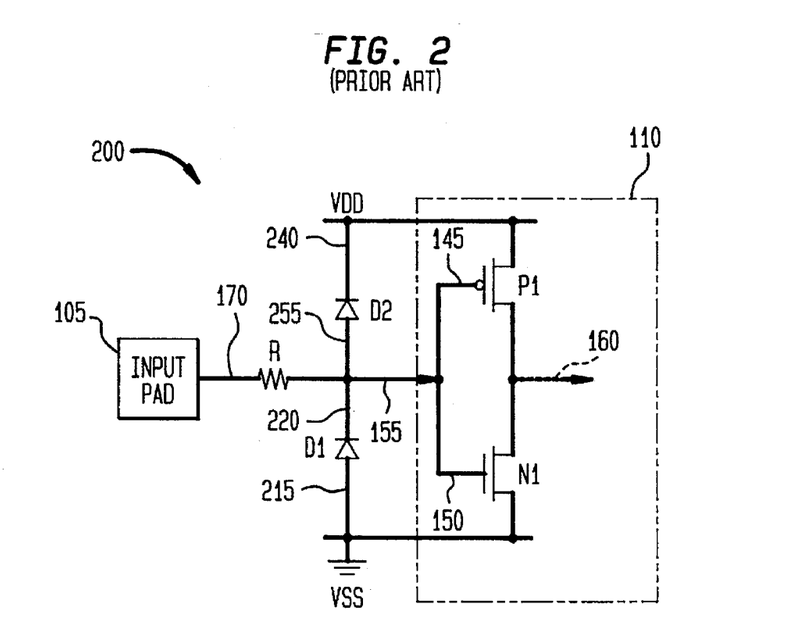
FIG. 2 shows a conventional ESD protection circuit with two diodes.

FIG. 2 shows another commonly used ESD protection circuit 200 connected between the input pad 105 and the input stage 110. As in the ESD protection circuit 100 of FIG. 1, one end of a resistor R is connected to the terminal 170 of the input pad 105. The resistor R may be a diffusion resistor or a polysilicon resistor (i.e., a resistor formed from polysilicon). The other end of the resistor R is connected to the terminal 155 which is connected to the gates 145, 150 of the MOS devices P1, N1 of the input stage 110.

The ESD protection circuit 200 provides two discharge paths; one from the terminal 155 to VSS through a diode D1 and another discharge path from the terminal 155 to VDD through a diode D2.

The first diode D1 has its anode 215 connected to the VSS bus and its cathode 220 connected to the terminal 155. The second diode D2 has its anode 255 also connected to the terminal 155, while its cathode 240 is connected to the VDD bus. While the circuit 200 provides some ESD protection, including two discharge paths, nevertheless ESD damage to the PMOS device P1 occurs in certain conditions. For example, when the VDD bus is floating, a positive 400 volt HBM (human body mode) ESD pulse with respect to the VSS bus, occurring at the input pad 105, damages the PMOS device P1.

Figure 3:
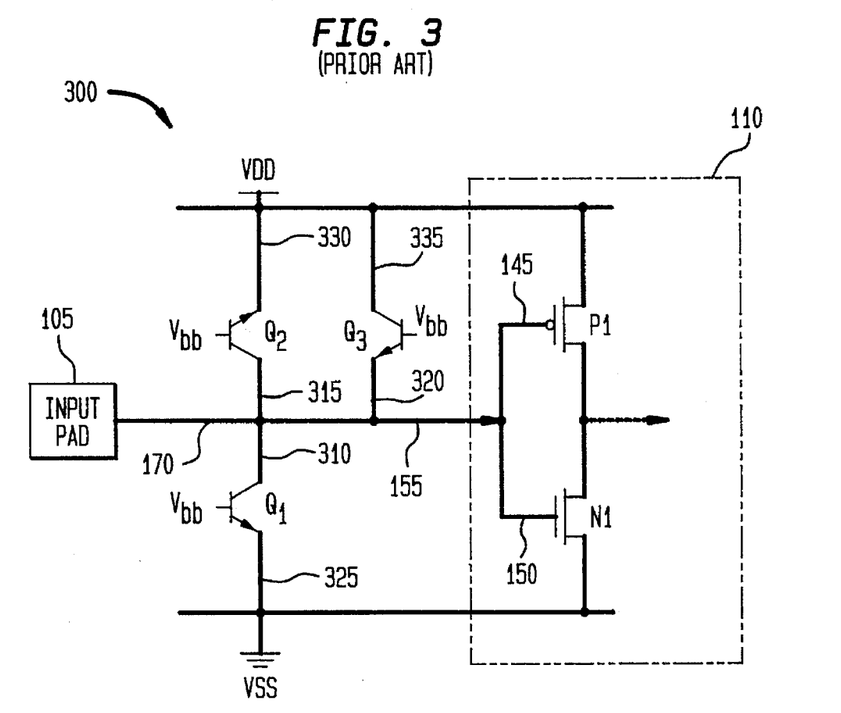
FIG. 3 shows a conventional ESD protection circuit with two bipolar junction transistors.

FIG. 3 shows another ESD protection circuit 300 connected between the input pad 105 and the input stage 110. In this ESD protection circuit 300, the resistor R of FIG. 2 is dispensed with, so that the input pad 105 is directly connected to the input stage 110. In addition, the diodes D1, D2 of FIG. 2 are replaced with lateral npn bipolar junction transistors (BJT). The ESD protection circuit 300, has one npn BJT Q1 placed between the input pad 105 and the VSS bus and two npn BJTs Q2, Q3 placed between the input pad 105 and the VDD bus. The collectors 310, 315 of Q1 and Q2 and emitter 320 of Q3 are connected to the terminal 170. The emitter 325 of Q1 is connected to the grounded VSS. The emitter 330 of Q2 and collector 335 of Q3 are connected to VDD.

As with the ESD protection circuit 200 of FIG. 2, the ESD protection circuit 300 also provides two ESD discharge paths; between the input pad 105 and both the VSS and VDD buses.

Thus, the diodes D1, D2 of FIG. 2 and the BJTs Q1, Q2 and Q3 of FIG. 3 protect the input stage 110 from both positive and negative ESD voltages either between the input pad 105 and the VDD bus or between the input pad 105 and the VSS bus. As mentioned above, the ESD protection circuits 200 of FIG. 2 and 300 of FIG. 3 provide two ESD paths; one ESD path from the input pad 105 to the VDD bus, and a second ESD path from the input pad 105 to the VSS bus. However, despite these two discharge paths, the initial turn on voltage of the diodes D1, D2 of FIG. 2, or the BJTs Q1, Q2 and Q3 are usually higher than the breakdown voltage of the thinner gate oxides MOS devices P1, N1 of the input stage 110 in deep submicron CMOS technology.

Figure 4:
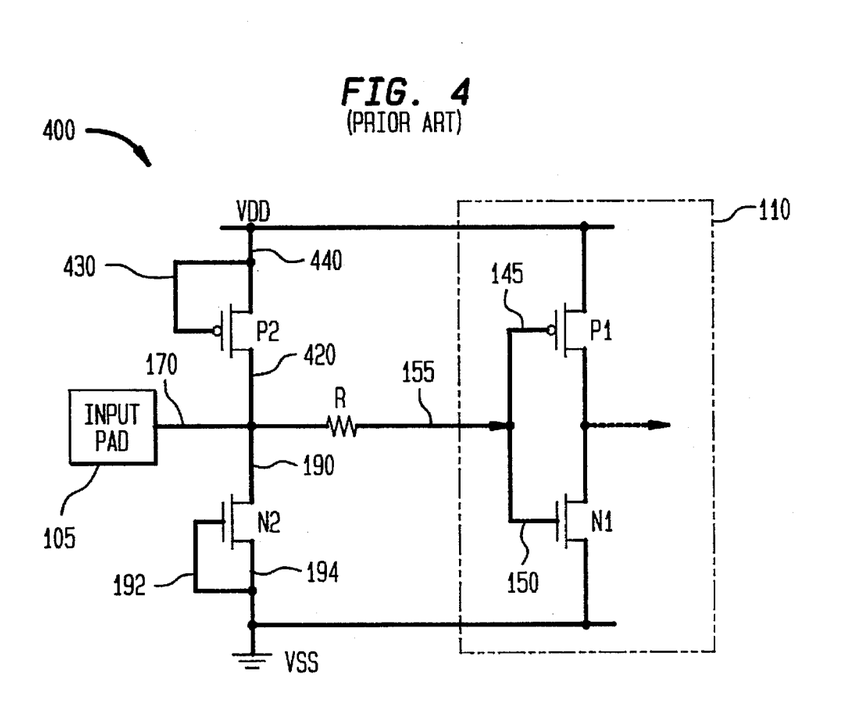
FIG. 4 shows a conventional ESD protection circuit with both PMOS and NMOS thin-oxide devices.

FIG. 4 shows yet another commonly used ESD protection circuit 400 having the thin-oxide NMOS device N2 (also shown in FIG. 1) connected between the terminal 170 of the input pad 105 and the VSS bus which is grounded. As in FIG. 1, the resistor R is connected between the terminal 170 and the terminal 155 which is connected to the gates 145, 150 of the MOS devices P1 and N1 of the input stage 110. Similar to FIG. 2, the resistor R is a polysilicon resistor.

A thin-oxide PMOS device P2 is connected between the terminal 170 of the input pad 105 and the VDD bus. The drain 420 of the thin-oxide PMOS device P2 is connected to the terminal 170 of the input pad 105. The gate 430 and the source 440 of PMOS device P2 are connected to the VDD bus. Thus, the gates 192, 430 of each device N2, P2 are shorted to their respective sources 194 and 440, while the drains 190, 420 are connected to the terminal 170 of the input pad 105.

As in the ESD protection circuit 200 of FIG. 2 and 300 of FIG. 3, the ESD protection circuit 400 also provides two discharge paths (one path from the input pad 105 to the VDD bus, and a second path from the input pad 105 to the VSS bus). However, in ESD protection circuits using thin-oxide CMOS devices, the thin-oxide CMOS devices must be surrounded with double guard rings to overcome latchup which inhibits the CMOS devices. The thin-oxide NMOS N2 and PMOS P2 devices in the ESD protection circuit 400 are generally separated by the input pad 105. Therefore, the NMOS N2 and PMOS P2 are each surrounded by their own double guard rings. This results in even a larger total layout area.

Latchup occurs when the input signals are outside a predefined voltage range. When latchup occurs, a channel substrate diode, e.g., between a P-region of a PMOS and an N-substrate, becomes conducting and floods the substrate with charge carriers which could fire a parasitic thyristor, short circuiting the VDD and VSS supply voltages. A parasitic thyristor exists in both the ESD protection circuit 400 and the input stage 110. In FIG. 4, latchup may occur in the ESD protection circuit 400 or in the input stage 110.

Figure 5:
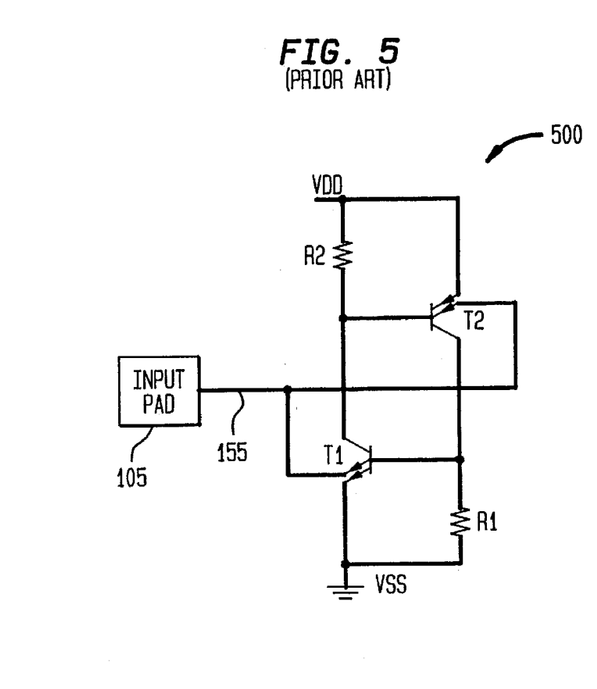
FIG. 5 shows a circuit having a parasitic thyristor between the input pad and the VSS, VDD supply voltages.

FIG. 5 shows a circuit 500 having a parasitic thyristor formed by T1 and T2 between the input pad 105 and the VDD, VSS buses. This parasitic thyristor formed by T1, T2 is produced due to the p-n junctions of the two P2, N2 MOS devices of the ESD protection circuit 400 of FIG. 4. Normally, this parasitic thyristor is off and has no effect, as the reverse currents are drained off via resistors R1 and R2.

Similarly, in normal operation, a parasitic thyristor in the input stage 110 (FIG 4) is also inhibited and turned off. The parasitic thyristor in the input stage 110 is similar to the parasitic thyristor T1, T2 shown in FIG. 5, which is off during normal operation. However, if one of the protective devices (such as the diodes D1, D2 of FIG. 2, the BJTs Q1, Q2 or Q3 of FIG. 3 or MOS devices N2, N3, or P2 of FIGS. 1 and 4), acting as an additional emitter, is biased in the forward direction, then the thyristor in the input stage 110 may be turned on. This short circuits VDD to VSS and the resulting high current destroys the IC chip. To prevent this latchup effect, the input (or output) voltage must not exceed the VDD supply voltage or fall below VSS (i.e., ground potential). Alternatively, or in addition to, the current flowing through the devices of the ESD protection circuit should be limited.

It is the object of the present invention to provide an ESD protection circuit which provides a full protection for ICs of submicron CMOS technology. It is another the object of the present invention to provide ESD protection without latchup problems in the ESD protection circuit. It is yet another object of the present invention to reduce the layout area requirement needed for the ESD protection circuit thus reducing the size and cost of the IC chips and increasing packing density.

A further object of the present invention is to protect both the NMOS and PMOS devices of the input stage. Another object is to provide a voltage clamping effect on the input signals provided to the input stage to be protected. Yet another object is to provide such a protection without adversely affecting the normal operation of the input stage and internal circuits which are being protected, such as maintaining reliability and speed of operation of the internal circuits.

SUMMARY OF THE INVENTION

The inventive ESD protection circuit comprises a primary ESD protection circuit and a secondary ESD protection circuit. The primary ESD protection circuit comprises a first and a second thick-oxide MOS devices. The first thick-oxide MOS device has a gate connected to the input pad and provides a source-to-drain path connecting the input pad to a first voltage supply.

The second thick-oxide MOS device has a gate connected to the input pad and provides a drain-to-source path connecting the input pad to a second voltage supply.

The secondary ESD protection circuit comprises a resistor connected between the input pad and an input terminal of the input stage. The secondary ESD protection circuit further comprises first and second thin-oxide MOS devices. The first thin-oxide MOS device has a gate and a source connected to the input terminal of the input stage, and a drain connected to the first voltage supply. The second thin-oxide MOS device has a drain connected to the input terminal, and a gate and a source connected to the second voltage supply.

The inventive ESD protection circuit fully protects the input stage of CMOS integrated circuits from four different ESD stress modes by providing four different ESD direct discharging paths. In addition, the inventive ESD protection circuit has a high ESD failure threshold, thus protecting against large ESDs, while occupying only a small layout area.

Furthermore, the inventive ESD protection circuit clamps to desirable levels the voltages applied to the thin-oxide CMOS input stage of the internal circuits. These voltage levels are clamped between 5.5 to −1 volts. The inventive ESD protection circuit has a higher turn-on voltage than the thin-oxide CMOS input stage devices. Therefore, the inventive circuit provides ESD protection without adversely affecting the normal operation of the internal circuits.

In addition, the inventive ESD protection circuit, having MOS devices of the same type, and merged latchup guard rings, is efficiently manufactured in a small layout area. This provides more compact yet fully protected IC chips.

DETAILED DESCRIPTION OF PREFERRED EMBODIMENTS OF THE INVENTION

A. Description of the Inventive Circuit

Figure 6:
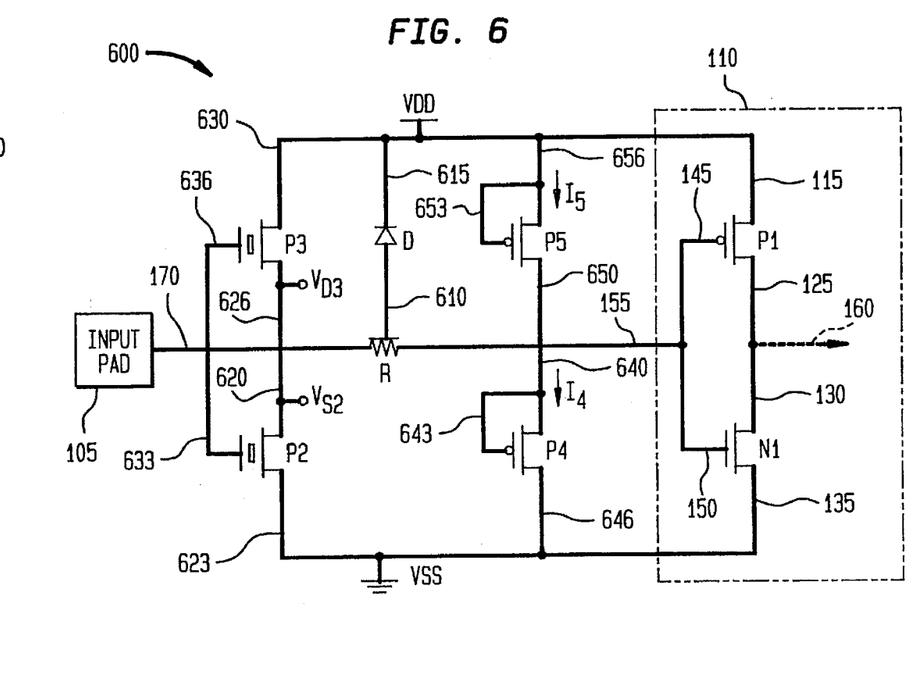
FIG. 6 shows an ESD protection circuit according to the present invention.

FIG. 6 shows a schematic diagram of an inventive latchup-free ESD protection circuit 600 according to an illustrative embodiment of the invention. The inventive ESD protection circuit 600 is formed integrally with a CMOS IC, for example, and provides ESD protection for the CMOS IC. The protection circuit 600 is connected between the input pad 105 and the input stage 110 of a CMOS IC.

The input stage 110 to be protected is the same as shown in FIGS. 1–5. That is, the input stage 110 comprises the thin-oxide PMOS device P1 and the thin-oxide NMOS device N1 having their drains 125, 130 connected together to form the output 160. The gates 145, 150 of P1 and N1 devices are also connected together to form an input for the input stage 110, which input is connected to the terminal 155 of the ESD protection circuit 600. The source 115 of the PMOS P1 is connected to the VDD bus while the source 135 of the NMOS N1 is connected to the VSS bus.

The output terminal 155 of the ESD protection circuit 600 is connected to the gates 145, 150 of the PMOS P1 and the NMOS N1. A resistor R is connected in series along the signal path between terminal 170 of the input pad 105 and terminal 155 of the ESD protection circuit 600.

The resistor R is preferably formed by diffusion of a P-type material into an N-substrate of the integrated circuit in accordance with well known techniques. Illustratively, a heavily doped P-type material is used to form the resistor R. That is, the resistor R is a $P^+$ diffusion type resistor. Diffusing the P-type material into the N-substrate inherently results in a junction between the P-type material and the N-substrate. This junction acts as a parasitic diode D. The anode 610 of the diode D is connected to the diffusion resistor R while the cathode 615 of the diode D is connected to the VDD bus.

The diffused resistor R also forms a capacitor (not shown) with the substrate. This capacitor, in combination with the resistor R, provides a delay line. A slight delay of an undesired pulse in reaching the protected input stage 110 provides more opportunity to shunt it around the input stage 110.

Illustratively, the P-type diffusion resistor R has a value of about 200 ohms. A larger diffusion R usually leads to a higher ESD failure threshold. However, this leads to a longer RC delay between the input pad 105 and input stage 110 which is undesirable for normal operation of the chip.

Four PMOS devices provide four ESD paths and are used to shunt positive and negative undesired pulses or ESDs to both the VDD and the VSS buses. Two of the four PMOS devices P2, P3 are thick-oxide devices while the remaining two PMOS devices P4, P5 are thin-oxide PMOS devices.

The first thick-oxide PMOS device P2 has its source 620 connected to the input pad 105 (i.e., terminal 170) and its drain 623 connected to the common VSS bus. The common VSS bus is grounded but may be connected to a voltage supply source VSS. The second thick-oxide PMOS device P3 has its drain 626 connected to the input pad 105 and its source 630 connected to the VDD bus which is connected to a voltage supply source VDD. The gate 633 of P2 and the gate 636 of P3 are also connected to the input pad 105. Illustratively, the gates 633, 636 of P2 and P3 are metal.

The first thin-oxide PMOS device P4 has its source 640 connected to its gate 643. The inter-connected source 640 and gate 643 are also connected to the terminal 155. The drain 646 of P4 is connected to the VSS bus. The second thin-oxide PMOS device P5 has its drain 650 connected to the terminal 155. The gate 653 and source 656 of the P5 are inter-connected and connected to the VDD bus. Illustratively, the gates 643, 653 of P4 and P5 are polysilicon.

The thick-oxide PMOS devices P2, P3 form a primary ESD protection while the diffusion resistor R and the thin-oxide PMOS devices P4, P5 form a secondary ESD protection. The diffusion resistor R also provides an ESD current limitation to the thin-oxide PMOS devices P4, P5.

Although using advanced CMOS technologies degrades the ESD protection provided by the thick-oxide MOS devices, inserting deep well regions in the drain of the thick-oxide PMOS overcomes this problem (see Y. S. Hu, H. R. Liauh, and M. C. Chang, "High Density Input Protection Circuit Design in 1.2 μm CMOS Technology", 1987 *EOS/ESD Symp. Proc.*, EOS-9, pp. 179–185). The thick-oxide PMOS devices P2, P3 of the inventive ESD protection circuit 600 have such deep wells inserted in their drains and sources as discussed later in connection with FIG. 8.

Having a thick-oxide gate increases the turn-on voltage of a MOS device. The thick-oxide devices P2, P3 typically have a turn-on voltage of approximately 16 volts or greater and −16 volts or smaller respectively. Thus, the turn-on voltage of the thick-oxide device P2 is much greater than 5 volts, which is the voltage level on the VDD bus used during normal operation of the MOS devices N1, P1 of the input stage 110. Therefore, connecting the metal gates 633, 636 of the thick-oxide devices P2, P3 to the input pad 105 does not adversely affect the operation of the input stage 110, because the thick-oxide devices P2, P3 remain off at 5 volts which is in the normal operating voltage range of P1, N1 of the input stage 110.

Moreover, connecting the metal gates 633, 636 to the input pad 105 provides a substantial benefit, namely, enhancing the turn-on speed of the thick-oxide devices P2, P3. This provides enhanced ESD protection against fast spikes with sharp rise times and narrow pulse widths.

B. Description of the Operation of the Inventive Circuit

The thin-oxide PMOS P1 of the input stage 110 is protected against ESD damage by the thick-oxide PMOS device P3, the diffusion resistor R and the thin-oxide PMOS device P5. The thin-oxide NMOS N1 of the input stage 110 is protected by the thick-oxide PMOS device P2, the diffusion resistor R and the thin-oxide PMOS device P4. In addition to providing an ESD protection, the inventive circuit 600 also clamps the voltage of input signals applied from the input pad 105.

1. Voltage Clamping Operation

During normal operating conditions, the PMOS devices of the ESD protection circuit 600 (P2, P3, P4 and P5) are all off. The thick-oxide PMOS devices P2, P3 are off because their the turn-on voltage is much higher than 5 volts, which is the normal operating voltage range of the input stage 110. The thin-oxide PMOS devices P4, P5 are off because their gates 643, 653 are connected to their sources 640, 656.

The voltage clamping during normal operation of the CMOS IC biased by VDD and VSS occurs as follows. The thin-oxide PMOS P4 with its gate 643 shorted to its source 640, but not connected to the VDD node, clamps an unexpectedly low voltage level of the signal present on terminal 155 (i.e., the input signal applied to the gates 145, 150 of the P1, N1 of the input stage 110) to a predetermined level. Illustratively, the predetermined clamped voltage level is −1 volts. For example, when a negative spike or pulse appears on the input terminal 155 of the input stage 110, then the thin-oxide PMOS P4 turns on and pulls down the voltage on the terminal 155 to VSS. This clamps the input signal to the predetermined level of −1 volts. That is, once the thin-oxide PMOS P4 turns on, the voltage level of the input signal at terminal 155 cannot go below −1 volts. The threshold voltage of the thin-oxide PMOS devices is about −0.8 to −1 volts in submicron CMOS technology.

On the other hand, when the input signal on terminal 170 increases above (VDD+0.5) volts, e.g., due a positive pulse thereon, then the diode D formed by the diffusion resistor R turns on and pulls up the input signal to VDD. This clamps the input signal to a maximum of 5.5 volts (i.e., VDD+0.5 volts, where VDD is 5 volts).

Input signal transitions or noise cause spikes or pulses, such as positive overshoots or negative undershoots, to appear on the input signal coming from the terminal 170 of the input pad 105. However, the ESD protection circuit 600 clamps the input voltage approximately between 5.5 volts and −1 volt as explained above.

Therefore, the inventive ESD protection circuit 600 not only performs the ESD protection by shunting spikes away from the input stage 110, but also provides a voltage clamping effect on the input signals.

2. ESD Protection

There are four modes of ESD stress conditions appearing on a signal pin of the IC chip connected to the input pad 105. The four ESD stress modes are associated with positive and negative polarities of the ESD voltages relative to both VDD and VSS buses which are connected to the VSS and VDD pins of the IC chip. The four different ESD stress modes are as follows:

1. PS Mode: Where the ESD stress at the signal pin is a positive ESD voltage relative to the grounded VSS pin, when the VDD pin is floating.
2. NS Mode: Where the ESD stress at the signal pin is a negative ESD voltage relative to the grounded VSS pin, when the VDD pin is floating.
3. PD Mode: Where the ESD stress at the signal pin is a positive ESD voltage relative to the VDD pin, when the VSS pin is floating.
4. ND Mode: Where the ESD stress at the signal pin is a negative ESD voltage relative to the VDD pin, when the VSS pin is floating.

In the PS mode, the positive ESD voltage is applied to the source 640 of thin-oxide PMOS device P4 through the diffusion resistor R. When the positive ESD voltage is greater than the breakdown or snapback voltage Vsb of the thin-oxide PMOS device P4, which is approximately 13 volts depending on the CMOS process, the thin-oxide PMOS device P4 is turned on by breakdown because its gate 643 is connected to its source 640. This clamps the positive ESD voltage at the terminal 155 to about 13 volts.

The clamping protects the gate oxides 145, 150 of the input stage 110. The current through the diffusion resistor R, which is due to the thin-oxide P4 breakdown by an ESD pulse, causes a voltage drop at the source 620 of the thick-oxide PMOS device P2 to be about (|Vsb4|I+14R), that is, $$V_{S2} = (|Vs4| + I_4 R)$$

where:

$V_{s2}$ is the voltage on the source 620 of the thick-oxide PMOS device P2,

Vsb4 is the snapback voltage of the thin-oxide PMOS device P4, $I_4$ is the current through the snapbacked thin-oxide PMOS device P4, from the source 640 to the drain 646, and R is the resistance of the diffusion resistor R.

When the source voltage $V_{S2}$ of the thick-oxide device P2 is above P2's breakdown voltage, which is approximately 16 volts depending on the CMOS process, then P2 will be turned on by breakdown. This causes the ESD current to be shunted to the VSS bus. Thus, the ESD current is mainly discharged by the thick-oxide PMOS device P2 while the thin-oxide PMOS device P4 clamps the input voltage of the input stage 110 so as to protect the gates 145, 150.

Figure 8:
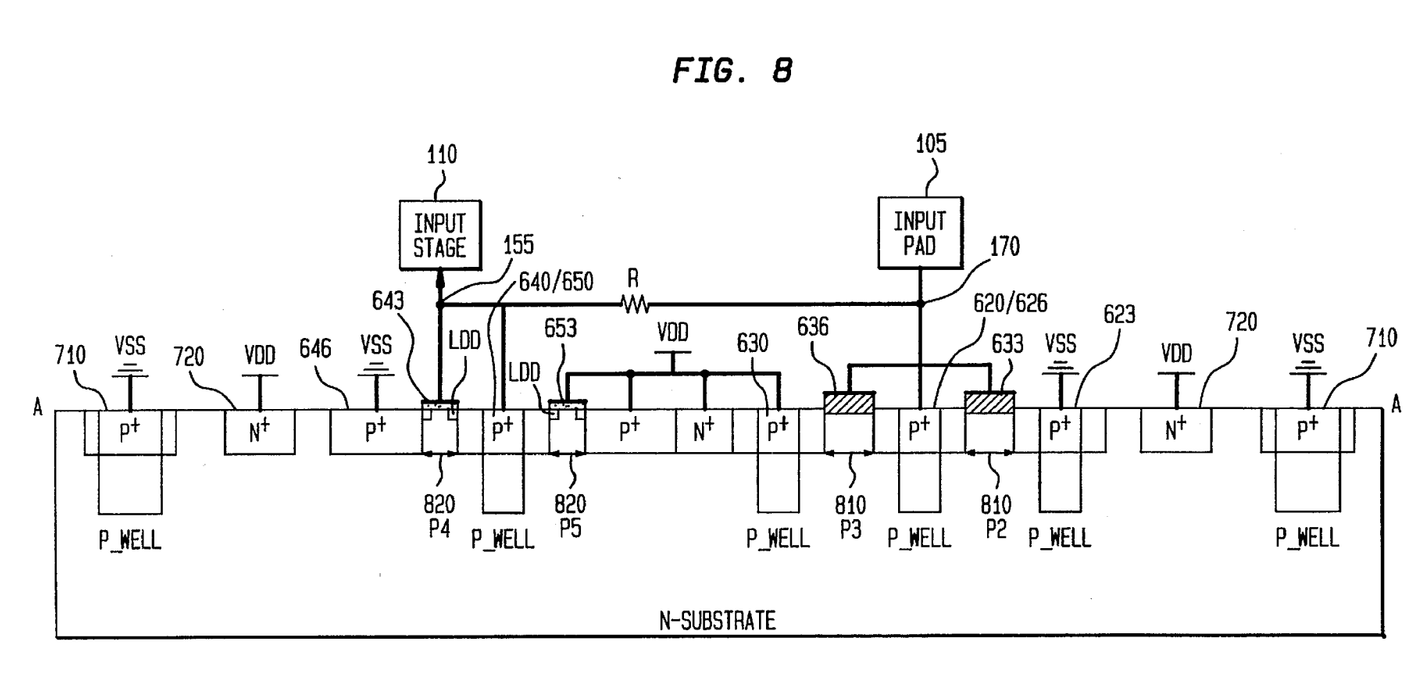
FIG. 8 shows a cross sectional view along the line A—A' of FIG. 7.

The thin-oxide PMOS device P4 has a short channel (820 of FIG. 8) which is between its drain 646 and its source 640 (see FIG. 8). The shorter the channel of P4, the smaller the snapback voltage |Vsb4| of the thin-oxide PMOS device P4.

The current 14 through P4 is proportional to the dimension of the thin-oxide PMOS P4 device. Similarly, the value of the resistance R is proportional to size of the p-type diffusion region. Therefore, by varying the dimension of P4 and the resistance R, a suitable ESD protection circuit 600 can be designed.

In the NS mode, the thin-oxide PMOS device P4 is forward conducting, because a negative voltage is applied to the input pad 105. Therefore, with the help of the diffusion resistor R, the ESD current is bypassed by the forward conducting P4. This forward conducting P4 condition has a very high ESD protection capability protecting against ESDs of more than 10 Kv of HBM.

In the PD mode, where the ESD stress at the terminal 170 of the input pad 105 is a positive ESD voltage relative to the grounded VDD bus, when the VSS bus is floating, the diode D becomes forward biased and conducts. The forward conducting diode D shunts the ESD current to the VDD bus. The diode D, under the forward conducting condition, also has a very high ESD protection capability.

In the ND mode, where the ESD stress at the terminal 170 of the input pad 105 is a negative ESD voltage relative to the grounded VDD bus, when the VSS bus is floating, the negative ESD voltage is applied to the drain 650 of the short channel thin-oxide PMOS device P5 through the diffusion resistor R. When the negative ESD voltage is less than the breakdown snapback voltage Vsb of the thin-oxide PMOS device P4, which is approximately −13 volts depending on the CMOS process, the thin-oxide PMOS device P5 is turned on by breakdown because its gate 653 is connected to its source 656. This clamps the negative ESD voltage to about −13 volts. Thus, the gate 145, 150 of P1, N1 of the input stage 110 are protected.

The current through the diffusion resistor causes $V_{D3}$, the voltage on the drain 626 of the thick-oxide device P3, to be about (Vsb5−I₅R), that is, $$V_{D3} = (Vsb5 - I_5 R)$$

where:

Vsb5 is the snapback voltage of the thin-oxide PMOS device P5 having a negative value, $I_5$ is a positive value and is the current through the snapbacked thin-oxide PMOS device P5, from the source 656 to the drain 650, and R is the resistance of the diffusion resistor R.

The drain voltage $V_{D3}$ of the thick-oxide device P3 is a negative voltage. When the drain voltage $V_{D3}$ of the thick-oxide device P3 is below P3's breakdown voltage, which is approximately −16 volts depending on the CMOS process, then P3 will be turned on by breakdown. This causes the ESD current to be shunted to the VDD bus. Thus, the ESD current is mainly discharged by the thick-oxide PMOS device P3 while the thin-oxide PMOS device P5 clamps the input voltage of the gate oxides 145, 150 of the input stage 110.

The shorter the channel of P5, the smaller the snapback voltage |Vsb5| of the thin-oxide PMOS device P5. The current $I_5$ through P5 is proportional to the dimension of the thin-oxide PMOS P5 device. Therefore, by varying the dimension of P5 and the resistance R, a suitable ESD protection circuit 600 can be designed.

C. Description of a Layout of the Inventive Circuit

Figure 7:
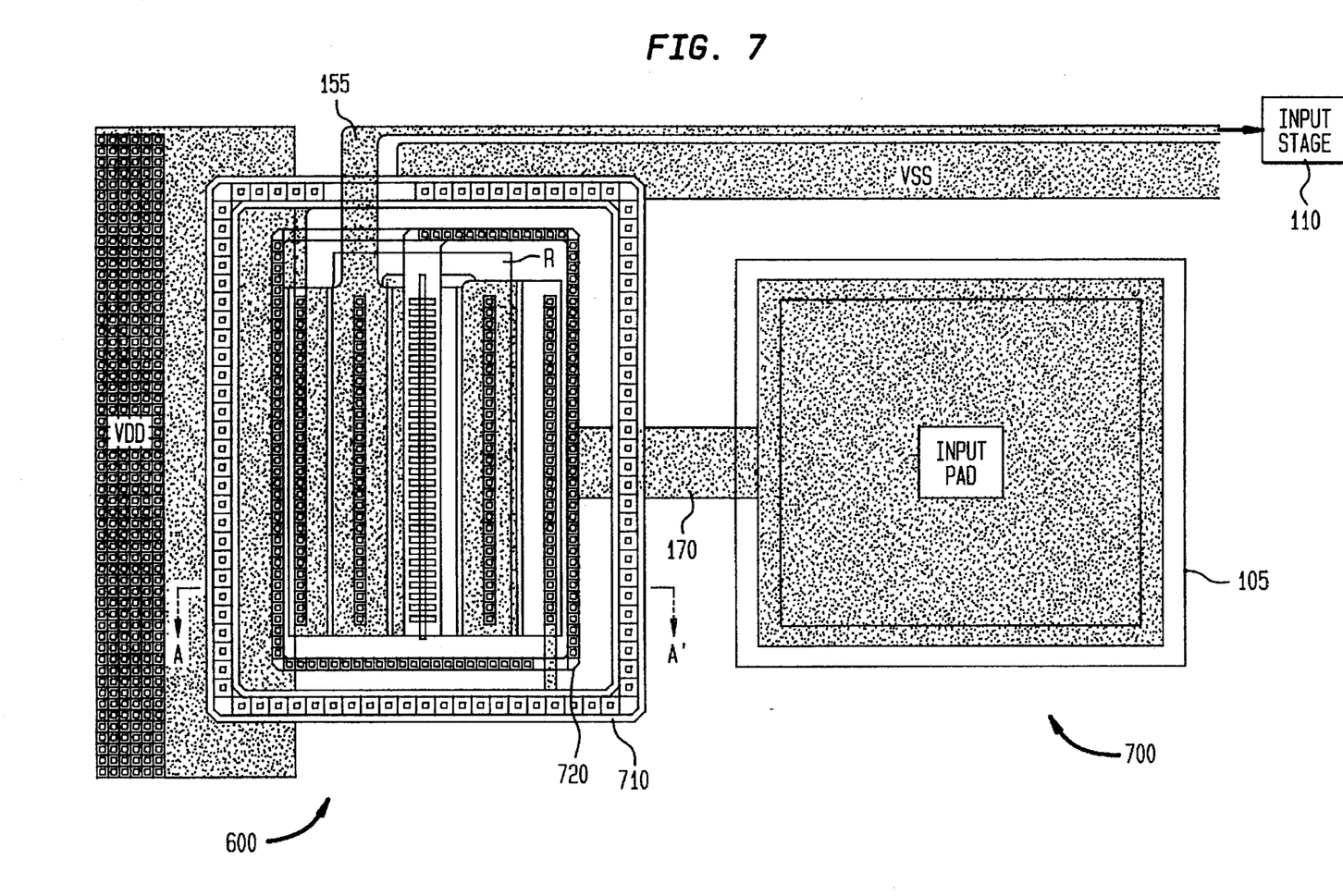
FIG. 7 shows a pattern layout of the inventive ESD protection circuit shown in FIG. 6.

A preferred layout of the circuit of FIG. 6 on the silicon integrated circuit chip is illustrated in FIGS. 7–8. This preferred layout provides a compact layout style as shown in FIG. 7. FIG. 7 shows a plan view of the layout of the ESD protection circuit 600 connected to the input pad 105 and a VDD, VSS buses. The terminal 170 connects the input pad 105 to the ESD protection circuit 600 while the terminal 155 connects the ESD protection circuit 600 to the input stage 110.

The P⁺ diffusion resistor R is connected between the terminal 155 and the terminal 170. The outer edge of the ESD protection circuit 600 has a P⁺ guard ring 710. An additional N⁺ guard ring 720 is located within the P⁺ guard ring 710. The purpose of the N⁺ and P⁺ guard rings 710, 720 is to prevent the VDD-to-VSS latchup in the internal circuits connected to the output 160 of the input stage 110. The VDD-to-VSS latchup of the internal circuits of the CMOS IC would otherwise be triggered due to the overshooting or undershooting of input signals present on the input pad 105 and the ESD protection circuit 600. The N⁺ and P⁺ guard ring 710, 720 can sink extra substrate current generated by the overshoots or undershoots of the input signal. This prevents the injected substrate current from causing VDD-to-VSS latchup in the internal circuits of the CMOS IC.

In this layout 700 shown in FIG. 7, all the elements of the ESD protection circuit 600 and the latchup prevention guard rings 710, 720 are merged together to effectively reduce the layout area. The dashed line A—A' of FIG. 7 is used to show the corresponding cross sectional view in FIG. 8.

FIG. 8 shows the P⁺ and N⁺ guard rings 710 and 720, respectively, wherein the P⁺ guard ring 710 is connected to the VSS bus, which is normally grounded, and the N⁺ guard ring 720 is connected to the VDD bus. The P⁺ guard ring 710 as well as the drains and sources of the PMOS devices (both thick and thin-oxide PMOS devices P2, P3, P4 and P5 of FIG. 6) are P+ diffusion regions. Illustratively, the width of each P+ diffusion regions 710 is a 6 μm.

The outer P⁺ diffusion region which is connected to the VSS bus act as the collector guard ring 710 of a parasitic p-n-p transistor. The N+ diffusion region, acting as a base guard ring 720, is 5 μm wide and is connected to the VDD bus. A deep P-well region is provided in some of 6 μm P⁺ diffusion regions. In particular, deep P-well region is provided in the P⁺ diffusion regions of the following: the outer guard ring 710, the drain 623 of P2, the source 620 of P2 or drain 626 of P3, the source 630 of P3, and the source 640 of P4 or drain 650 of P5.

The deep P-wells inserted in the drain and source structure of the MOS devices increase the ESD current flowing paths and improve the ESD protection capability of these MOS devices. Illustratively, the depth of the P-well region is about 3 µm.

The channel length 810 of the P2 and P3 MOS devices, which provide the primary ESD protection, is 2 µm. The channel lengths 820 of the P4 and P5, which provide the secondary ESD protection, is 1 µm.

The spacing of the drain and source contacts to the edges of the gates of P2 and P3 or P4 and P5 is an important layout parameter. The spacing is illustratively 5 µm and each contact size is 2×2 µm² (not shown in the FIG. 7). The gates of the P4 and P5 have an LDD structure in the channel 820.

Because all the elements in the inventive ESD protection circuits are all P-type devices, there is no VDD-to-VSS latchup problems in this inventive ESD protection circuit. As shown in FIG. 7, the structure of P2, P3, P4 and P5, as well as the guard rings 710, 720, are merged together to further reduce layout area.

Illustratively, with a layout of 100×150 µm², the inventive ESD protection circuit, including the VDD biased N+ diffusion and VSS biased P+ diffusion latchup guard rings 710, 720, is fabricated by a 0.8 micrometer twin well CMOS process with an LDD structure. The inventive circuit, despite its small layout area, protects against ESD levels in excess of 4 kilovolts HBM ESD stresses with either positive or negative polarities to both the VDD and the VSS nodes.

In short, the present invention is an ESD protection circuit which has four different ESD direct discharging paths. These paths protect against four modes of ESD stresses. Therefore, the inventive circuit 600 fully protects the input stage 110 of a CMOS IC chip against ESD damages.

In the PS and ND ESD stress modes, the devices P2, P3 are in their breakdown condition to mainly discharge the ESD currents. Therefore, the ESD currents are shunted to the VSS and VDD buses. The thick-oxide devices P2, P3, with the deep P-well structure, are able to sustain much higher ESD stresses than the thin-oxide devices in the PS mode and ND mode.

In the other two ESD stress modes (NS and PD modes), the thin-oxide PMOS devices P4, P5 and junction diode D are forward conducting. This also shunts the ESD currents to the VSS and VDD buses. The forward conducting P4 and junction diode D can sustain much higher ESD stresses. Therefore, the inventive circuit provides effective ESD protection against four modes of ESD damage with high ESD failure threshold in a small layout area.

In addition, the ESD voltage of the input stage of the CMOS IC's is clamped by the thin-oxide P4 and P5 devices in the PS and ND ESD stress modes. The snapback voltage of the short channel thin-oxide P4 and P5 devices is smaller than the gate oxide breakdown voltage of the P1, N1 MOS devices of the input stage. Thus, the gates of the thin-oxide P1, N1 MOS devices are effectively protected.

This is unlike an ESD protection circuit having lateral npn bipolar transistors. Lateral npn bipolar transistors have a higher turn-on voltage than the gate-oxide breakdown voltage of the thin-oxide MOS devices of the input stage in submicron CMOS technology. Therefore, it is dangerous to use only an npn BJT to clamp the ESD voltage present on the gate oxide of the thin-oxide MOS devices of the input stage in submicron CMOS ICs.

The present invention also discloses an integrated circuit incorporating the inventive ESD protection circuit in a small layout area. The layout efficiency of the inventive ESD protection circuit is greatly improved due to merging the latchup guard rings together which save layout area. With a small layout area and a high ESD protection capabilities, the inventive ESD protection circuit is very suitable for high density applications of CMOS VLSI/ULSI used in submicron technology.

The invention can be also implemented in the N-well P substrate CMOS process by changing the P-type device to an N-type device. The inventive ESD protection circuit provides effective ESD protection above 4 kilovolts of HBM within a small layout area. In addition, the inventive ESD protection circuit clamps the voltage levels of the input signal applied to the gates 145, 150 of the input stage 110 of the thin-oxide P1, N1 MOS devices. This confines the input signal applied to the gates 145, 150 to approximately from 5.5 volts to −1 volt in normal operation of CMOS ICs, where VDD is 5 volts and VSS is 0 volts.

The inventive ESD protection circuit is process compatible and suitable with conventional or advanced CMOS and BiCMOS technologies.

The above-described embodiment of the present invention is intended to be illustrative only. Numerous alternative embodiments may be devised by those skilled in the art without departing from the spirit and scope of the following claims.

We claim:

1. An input protection circuit for protecting an input of a large-scale micron to deep submicron MOS device from excessive ESD voltage by providing four different ESD direct discharging paths comprising:

an input pad;

an output terminal;

a first thick-oxide MOS device having a gate connected to said input pad, and having a source-to-drain path connecting said input pad to a first voltage supply;

a second thick-oxide MOS device having a gate connected to said input pad, and having a drain-to-source path connecting said input pad to a second voltage supply, wherein said first and second thick-oxide MOS devices form a primary electrostatic discharge protection;

a resistor connected between said input pad and said output terminal;

a first thin-oxide MOS device having a gate and a source connected to said output terminal, and having a drain connected to said first voltage supply; and a second thin-oxide MOS device having a drain connected to said output terminal, and having a gate and a source connected to said second voltage supply, wherein said resistor and said first and second thin-oxide MOS devices form a secondary electrostatic discharge protection.

2. The input protection circuit of claim 1 wherein said resistor is a diffusion resistor.

3. The input protection circuit of claim 2 wherein said diffusion resistor, said first and second thick-oxide MOS devices and said first and second thin-oxide MOS devices are p-type.

4. The input protection circuit of claim 2 further comprising a parasitic diode connected between said diffusion resistor and said second voltage supply.

5. A protection circuit for protecting an input pad and an input stage of a CMOS chip from excessive ESD voltage by providing four different ESD direct discharging paths, where the chip has a negative power supply bus (VSS) and a positive power supply bus (VDD), said protection circuit comprising:

a first thick-oxide MOS device connected to conduct ESD currents of one polarity between the input stage and the negative power supply bus, a second thick-oxide MOS device connected to conduct ESD currents of said one polarity between the positive power supply bus and the input stage, a first thin-oxide MOS device connected to shunt ESD currents of the other polarity between the negative power supply bus and the input stage, and to clamp a positive ESD voltage at the input stage to a positive predetermined value, a diode connected to shunt ESD currents of said other polarity between the input stage and the positive power supply bus, and a second thin-oxide MOS device connected to clamp a negative ESD voltage at the input stage to a negative predetermined value.

6. The protection circuit of claim 5 further comprising a diffusion resistor connected between said input pad and said input stage.

7. An integrated circuit which protects an input of a MOS device from excessive ESD voltage by providing four different ESD direct discharging paths comprising:

a substrate of a first conductivity type;

a plurality of heavily doped regions of a second conductivity type formed in said substrate, said regions defining source and drain regions of a first and second thick-oxide field effect devices and a first and second thin-oxide field effect devices;

two thick-oxide gates formed on said substrate between said source and drain regions of said first and second thick-oxide field effect devices; and two thin-oxide gates formed on said substrate between said source and drain regions of said first and second thin-oxide field effect devices;

a well of said second conductivity type implanted through said drain regions in said substrate;

guard rings formed in said substrate and located around the periphery of said integrated circuit; and a diffusion resistor of said second type formed in said substrate between said two thick-oxide gates and said two thin-oxide gates.

8. An integrated circuit of claim 7 wherein said guard rings comprise an outer guard ring of a heavily doped second conductivity type, and an inner guard ring of a heavily doped first conductivity type.

9. An integrated circuit of claim 8 further comprising a well of said second conductivity type implanted through said outer guard ring in said substrate.

10. An integrated circuit of claim 9 wherein a lightly doped drain structure is formed below said two thin-oxide gates in said substrate.

11. A circuit for protecting a MOS device from a positive electrostatic discharge relative to a negative voltage supply by providing four different ESD direct discharging paths comprising:

an input pad;

an output terminal;

a thick-oxide MOS device having a gate and a source connected to said input pad, and having a drain connected to said negative voltage supply;

a resistor connected between said input pad and said output terminal; and a thin-oxide MOS device having a gate and a source connected to said output terminal, and having a drain connected to said negative voltage supply;

wherein said thick-oxide MOS device turns on to shunt ESD currents from said input terminal to said negative voltage supply, and wherein said thin-oxide MOS device clamps a signal on said output terminal to a predetermined positive voltage level.

12. The circuit of claim 11 wherein said negative voltage supply is grounded.

13. A circuit for protecting a MOS device from a negative electrostatic discharge relative to ground by providing four different ESD direct discharging paths comprising:

an input pad;

an output terminal;

a thick-oxide MOS device having a gate and a source connected to said input pad, and having a drain connected to said ground;

a resistor connected between said input pad and said output terminal; and a thin-oxide MOS device having a gate and a source connected to said output terminal, and having a drain connected to said ground;

wherein said thin-oxide MOS device is forward conducting to shunt ESD currents from said input terminal to said ground.

14. A circuit for protecting a MOS device from a positive electrostatic discharge relative to a positive voltage supply by providing four different ESD direct discharging paths comprising:

an input pad;

an output terminal;

a thick-oxide MOS device having a gate and a drain connected to said input pad, and having a source connected to said positive voltage supply;

a resistor connected between said input pad and said output terminal;

a parasitic diode connected between said resistor and said positive voltage supply; and a thin-oxide MOS device having a gate and a drain connected to said output terminal, and having a source connected to said positive voltage supply;

wherein said parasitic diode is forward conducting to shunt ESD currents from said input terminal to said positive voltage supply.

15. A circuit for protecting a MOS device from a negative electrostatic discharge relative to a positive voltage supply by providing four different ESD direct discharging paths comprising:

an input pad;

an output terminal;

a thick-oxide MOS device having a gate and a drain connected to said input pad, and having a source connected to said positive voltage supply;

a resistor connected between said input pad and said output terminal; and a thin-oxide MOS device having a gate and a drain connected to said output terminal, and having a source connected to said positive voltage supply;

wherein said thin-oxide MOS device clamps a signal on said output terminal to a predetermined negative voltage level.

16. A protection circuit for protecting an input pad and an input stage of a CMOS chip from excessive ESD voltage in four ESD stress modes by providing four different ESD direct discharging paths, said four ESD stress modes being a PS, an NS, a PD and an ND ESD stress modes, where the chip has a negative power supply bus (VSS) and a positive power supply bus (VDD), said protection circuit comprising:

a first thick-oxide MOS device connected to conduct ESD currents of one polarity between the input stage and the negative power supply bus in a PS ESD stress mode, a second thick-oxide MOS device connected to conduct ESD currents of said one polarity between the positive power supply bus and the input stage, a first thin-oxide MOS device connected to shunt ESD currents of the other polarity between the negative power supply bus and the input stage in said NS ESD stress mode, and to clamp a positive ESD voltage at the input stage to a positive predetermined value in said PS ESD stress mode, a diode connected to shunt ESD currents of said other polarity between the input stage and the positive power supply bus in said PD ESD stress mode, and a second thin-oxide MOS device connected to clamp a negative ESD voltage at the input stage to a negative predetermined value in said ND ESD stress mode.

* * * * *